United States Patent

Nakagawa et al.

[11] Patent Number: 6,106,899
[45] Date of Patent: Aug. 22, 2000

[54] METHOD FOR SURFACE TREATMENT OF COPPER OR COPPER ALLOYS

[75] Inventors: Toshiko Nakagawa; Ryo Ogushi, both of Amagasaki, Japan

[73] Assignee: MEC Company Limited, Amagasaki, Japan

[21] Appl. No.: 09/116,339

[22] Filed: Jul. 16, 1998

[30] Foreign Application Priority Data

Jul. 24, 1997 [JP] Japan .................................. 9-198788

[51] Int. Cl.⁷ ....................................... B05D 3/00
[52] U.S. Cl. ........................ 427/327; 427/409; 427/410
[58] Field of Search ..................... 427/327, 409, 427/410

[56] References Cited

U.S. PATENT DOCUMENTS

| | | | |
|---|---|---|---|
| 3,645,772 | 2/1972 | Jones | 117/34 |
| 4,428,987 | 1/1984 | Bell et al. | 427/327 |
| 4,917,758 | 4/1990 | Ishizuka et al. | 156/630 |
| 5,449,549 | 9/1995 | Even et al. | 428/245 |
| 5,496,590 | 3/1996 | Maki et al. | |
| 5,532,094 | 7/1996 | Arimura et al. | 252/79.1 |
| 5,700,389 | 12/1997 | Nakagawa . | |
| 5,744,069 | 4/1998 | Maeda et al. . | |
| 5,773,132 | 6/1998 | Blumberg et al. | 428/209 |
| 5,800,859 | 9/1998 | Price et al. | 427/98 |

FOREIGN PATENT DOCUMENTS

| | | |
|---|---|---|
| 0 170 414 | 2/1986 | European Pat. Off. . |
| 0 670 379 | 9/1995 | European Pat. Off. . |
| 1074076 | 6/1967 | United Kingdom . |
| 2 102 453 | 2/1983 | United Kingdom . |
| WO 96/19097 | 6/1996 | WIPO . |
| WO 96/36747 | 11/1996 | WIPO . |

*Primary Examiner*—Shrive Beck
*Assistant Examiner*—Jennifer Calcagni
*Attorney, Agent, or Firm*—Oblon, Spivak, McClelland, Maier & Neustadt, P.C.

[57] ABSTRACT

A method for bonding a resin which has a high glass transition temperature but low affinity to copper surfaces with a copper surface with sufficient adhesive strength. The method comprises coating the copper surfaces with an aqueous solution containing at least 0.05% of aminotetrazole or an aminotetrazole derivative, or an aqueous solution containing at least 0.05% of aminotetrazole or an aminotetrazole derivative and at least 0.1% of aminotriazole or an aminotriazole derivative.

15 Claims, No Drawings

METHOD FOR SURFACE TREATMENT OF COPPER OR COPPER ALLOYS

BACKGROUND OF THE INVENTION

1. Field of the Invention

The present invention relates to a method for surface treatment of copper or copper alloys (hereinafter collectively referred to as "copper"), which is useful in applications such as the manufacture of printed circuit boards.

2. Description of the Background Art

Up to now, conventional printed circuit boards used extensively in electronic appliances have been built on an FR-4 grade base material, such as a lamination of a copper foil, a prepreg, a circuit board for internal layer, another prepreg, and a copper foil, overlaid in that order. However, due to the rapidly accelerating trend in recent years toward packing numerous electronic components tightly onto a board, thermal resistances that cannot be met by the FR-4 grade materials are being required since such components tend to heat up. Meanwhile, as the frequency of electronic signals passing through a printed circuit board becomes higher and higher, the base material is required to have reduced levels of dielectric loss tangent as well as dielectric constant.

Accordingly, instead of ordinary bisphenol-A resin or novolak type epoxy resin as the impregnating resin for prepregs, use of resins with higher glass transition temperatures such as heat-resistant epoxy resin, bismaleimide-triazine resin, polyphenylene ether, or polyimide is becoming popular for improving the heat resistance and the high frequency properties of a printed circuit board. Further, utilization of these highly heat resistant materials is also increasing as an inter-layer insulating material for manufacturing a printed circuit board via a build-up process. On the other hand, these resins with high heat resistance, i.e. resins having glass transition temperatures (as determined by the TMA method; applicable throughout this specification) of 150° C. or higher, are harder than conventional epoxy resins, and exhibit less adhesion to a copper foil as they possess a fewer number of polar groups. Therefore, when such a material is subjected to severe conditions such as a pressure cooker test where the material is humidified followed by heating, separation occurs between the resin and the copper foil to reveal the shortcomings mentioned.

As a solution to the above problems, for example, a method is disclosed in Japanese Patent Application Laid-Open No. 6035/1994 wherein the surface of a copper foil on which a prepreg is to be applied is first oxidized, then reduced, and treated further with an aminosilane coupling agent. However, since the silane coupling agent applied on the copper surface tends to be washed away in a cleaning process, it cannot be used for a continuous printed circuit board manufacturing process based on a horizontal type conveyor system for which water cleaning is an integral part.

Also, in another method disclosed in Japanese Patent Application Laid-Open No. 266241/1986, the surface of a copper foil to which a prepreg is to be applied is first oxidized, then reduced, and treated further with an aminotriazole solution or the like. However, as pointed out in Japanese Patent Application Laid-Open No. 258870/1995, it has become clear that the aminotriazole treatment is far from beneficial but detrimental to resin adhesion to the copper surface.

The present invention has been made in consideration of the above circumstances and has its objective in providing for a method for bonding a resin which has a high glass transition temperature but low affinity to copper surfaces, with a copper surface with sufficient adhesive strength.

SUMMARY OF THE INVENTION

The above objective is achieved in the present invention, by a method of treating a copper surface to be bonded with resins having a glass transition temperature of 150° C. or higher, which comprises coating the copper surface with an aqueous solution containing at least 0.05% (all percentage figures hereinafter referred to are in % by weight, unless otherwise specified) of aminotetrazole or a derivative thereof (hereinafter referred to as the first aqueous solution), or with an aqueous solution containing at least 0.05% of aminotetrazole or a derivative thereof, at least 0.1% of aminotriazole or a derivative thereof (hereinafter referred to as the second aqueous solution).

Other objects, features and advantages of the invention will hereinafter become more readily apparent from the following description.

DETAILED DESCRIPTION OF THE INVENTION AND PREFERRED EMBODIMENTS

The object of the surface treatment method in the present invention is a copper surface to be coated with a resin having a glass transition temperature of 150° C. or higher as determined by the TMA method in accordance with the procedures specified in JIS C 6481.

For further improvement in adhesiveness with the resin, the above copper surface may be roughened by a method such as an etching method (microetching method), electroplating method, electroless plating method, oxidizing method (black oxide, brown oxide), oxidation-reduction method, brush polishing method, or jet scrubbing method. Specific examples of the above-mentioned etching method include a method using MEC Etch Bond CZ-5480 and CZ-8100 (microetching agents manufactured by MEC Co., Ltd.), or the like, in addition to etching methods using a sulfuric acid—hydrogen peroxide type etching agent, persulfuric acid salt type etching agent, copper chloride type etching agent, or iron chloride type etching agent.

While there are no limitations for the above-mentioned resins with a glass transition temperature of 150° C. or higher, examples of such resins used for printed circuit boards include heat-resistant epoxy resin, bismaleimide-triazine resin, polyphenylene ether, and the like. Furthermore, the method in the present invention can give excellent effects even when the resin to be bonded has a glass transition temperature exceeding 200° C. and therefore shows difficulty in obtaining sufficient adhesive strength.

In the surface treatment method of the present invention, the copper surfaces as described above are coated with an aqueous solution containing at least 0.05% of aminotetrazole or an aminotetrazole derivative (the first aqueous solution), or an aqueous solution containing at least 0.05% of aminotetrazole or an aminotetrazole derivative and at least 0.1% of aminotriazole or an aminotriazole derivative (the second aqueous solution)

First, the following describes the first aqueous solution.

While examples of such an aminotetrazole derivative mentioned above include 1-methyl-5-aminotetrazole, 1-ethyl-5-aminotetrazole, (α-benzyl-5-aminotetrazole, β-benzyl-5-aminotetrazole, and 1-(β-aminoethyl)tetrazole, other substituent groups may be contained as long as the desired effect of the present invention is exhibited. The derivatives may be in the form of hydrates as well. Among the aminotetrazole or aminotetrazole derivatives mentioned above, aminotetrazole or those having short-chain alkyl groups are preferred. These aminotetrazole and aminotetrazole derivatives may be used either individually or in combinations of two or more.

The concentration of the aminotetrazole or aminotetrazole derivatives in the first aqueous solution is at least 0.05%, preferably between 0.1 to 5%, and more preferably, between 0.1 to 3%. If the concentration is below 0.05%, the effect in improving adhesiveness to the above-mentioned resins becomes insufficient. On the other hand, while there is no particular upper limit, a concentration higher than 5% will not lead to added improvement effects but only harm the economics of the process.

To assist dissolving of aminotetrazole or other compounds in water or to provide for a uniform treatment of the copper surfaces, the first aqueous solution may further contain appropriate amounts of water-soluble solvents such as alcohol, nonionic surfactants such as polyethers, ethylene oxide-propylene oxide copolymers (Pluronic types), and amino type polyethers, metal salts such as sodium sulfate, ammonium sulfate, ammonium chloride, and sodium chloride, or ammonia.

Next, the second aqueous solution is described.

When the second aqueous solution is used, unlike the results disclosed in Japanese Patent Application Laid-Open No. 258870/1995, aminotriazole or aminotriazole derivatives do not harm adhesiveness of the resins but instead improve it, since they are formulated together with aminotetrazole or aminotetrazole derivatives. In addition to this effect, use of aminotriazole or aminotriazole derivatives enables the provision of copper surfaces with excellent thermal resistance as well as moisture resistance.

As aminotetrazole or aminotetrazole derivative for the second aqueous solution, compounds similar to those in the first aqueous solution are used. As preferred aminotriazole derivatives, for example, 3-amino-5-methyltriazole, 3-amino-5-ethyltriazole, or the like can be mentioned. However, other substituent groups may be contained as long as the desired effect of the present invention is exhibited. These aminotriazole or aminotriazole derivatives may be used either individually or in combinations of two or more in the second aqueous solution.

The concentration of aminotetrazole and/or aminotetrazole derivatives in the second aqueous solution is at least 0.05%, preferably between 0.1 to 5%, and more preferably, between 0.3 to 3%. If the concentration is below 0.05%, the effect in improving adhesiveness to the above-mentioned resins becomes insufficient. Further, although there is no particular upper limit, a concentration higher than 5% will not lead to added improvement effects but only harm the economics of the process.

The concentration of aminotriazole and/or aminotriazole derivatives in the second aqueous solution is at least 0.1%, preferably between 0.3 to 5%, and more preferably, between 0.3 to 3%. If the concentration is below 0.1%, the effects in improving the thermal resistance and the moisture resistance of the copper surfaces become insufficient. While there is no particular upper limit, a concentration higher than 5% will not lead to added improvement effects but only harm the economics of the process.

As with the first aqueous solution, appropriate amounts of water-soluble solvents, nonionic surfactants, metallic salts, or ammonia may also be added to the second aqueous solution.

Also, there are no specific limitations for the method of applying the above-mentioned first and second aqueous solutions to the copper surfaces, where a satisfactory process, for example, comprises coating the copper surface using techniques such as a spray (shower) method or a dipping method, followed by rinsing with water and drying.

As described above, the method in the present invention enables improving adhesiveness to copper surfaces of resins having high glass transition temperatures. Therefore, it is extremely useful in the manufacture of printed circuit boards such as so-called "thin type multi-layer printed circuit boards" that are built with four or more layers of substrates, each having a thickness of 0.1 mm or less, or those for use with semiconductor packages.

Additionally, there are occasions where one side of a printed circuit board having copper circuitry patterns on both sides is coated first with a resin and heat-cured (the copper circuitry pattern on the other side being uncoated as yet), and then the other side is coated with the resin and heat-cured. Applying the second aqueous solution on such an occasion provides the uncoated copper surface with excellent surface protection by imparting heat resistance and moisture resistance. The excellent surface protection effect is also available when the bonding of copper and a resin is performed under high temperature. These effects become particularly noticeable when the copper surface is roughened by processes such as microetching and made ready for oxidation.

Furthermore, use of the method in the present invention also enables attaining higher peel strength for conventional epoxy resins such as bisphenol-A type epoxy resin or novolak type epoxy resin having a glass transition temperature lower than 150° C., and if the second aqueous solution is used in addition, provides extra heat resistance and moisture resistance as well.

Other features of the invention will become apparent in the course of the following description of the exemplary embodiments which are given for illustration of the invention and are not intended to be limiting thereof.

EXAMPLES

Examples 1–6 and Comparative Examples 1–4
Inter-Layer Peel Test

Exterior copper surfaces of copper-plated laminates for printed circuit boards were etched to a depth of approximately 3 $\mu$m using MEC Etch Bond CZ-8100 (manufactured by MEC Co., Ltd.). The etching depth was calculated from the weight of copper removed, surface area, and the density of the copper. Subsequently, the above etched laminates were immersed in aqueous solutions prepared with the composition as listed in Table 1, for 15 seconds at 20° C., rinsed with water, and then dried. Treatment with the aqueous solution was not carried out for the Comparative Example 1.

On the laminates prepared as above, two sheets of a 0.1 mm-thick prepreg (GHPL830 manufactured by Mitsubishi Gas Chemical, Inc.) using bismaleimide-triazine resin with a glass transition temperature of 170–220° C. as the impregnating resin were overlaid and pressed under heat.

The resultant laminates were then allowed to degrade for 2 hours under conditions of 121° C., a 100% relative humidity, and 2-atmosphere pressure, immersed subsequently in molten solder at 260° C., and inspected for inter-layer peeling between the resin and the copper surface (lifting of the copper foil from the resin). The evaluation results are given in Table 1, where ◯ denotes no lifting at all, Δ denotes occurrence of slight lifting (minute spot-like swellings), × denotes much lifting, and ×× very much lifting.

Peel-Off Strength Test

The surfaces of electrolytic copper foils were etched to a depth of approximately 3 μm using MEC Etch Bond CZ-8100 (manufactured by MEC Co., Ltd.). The foils were then immersed in aqueous solutions prepared with the composition as listed in Table 1 for 15 seconds at 20° C., rinsed with water, and then dried.

On the copper foils prepared as above, two sheets of the aforementioned prepregs using bismaleimide-triazine resin as the impregnating resin were overlaid and pressed under heat.

The copper foils on the resultant laminates were inspected for peel-off strength in accordance with JIS C 6481. Results are given in Table 1.

Heat Resistance Test

As with the above peel-off test, the surface of the electrolytic copper foils was etched, treated with aqueous solutions with the composition as listed in Table 1, rinsed with water, and then dried. The resultant copper foils were then heated to 130° C. for 1 hour and inspected for surface discoloration. The evaluation results are given in Table 1, where ○ denotes no discoloration, Δ denotes minor discoloration, ×, major discoloration, and ××, severe discoloration.

Moisture Resistance Test

As with the above peel-off test, the surface of the electrolytic copper foils was etched, treated with aqueous solutions with the composition as listed in Table 1, rinsed with water, and then dried. The resultant copper foils were then allowed to stand under conditions of 50° C. and 95% relative humidity for 18 hours, and inspected for surface discoloration. The evaluation results are given in Table 1, where ○ denotes no discoloration, Δ denotes minor discoloration, ×, major discoloration, and ××, severe discoloration.

TABLE 2

| Example | Composition of aqueous solution (% by weight) | | Inter-layer peel test | Peel-off strength (kgf/cm) |
|---|---|---|---|---|
| 7 | Aminotetrazole | 1.0 | ○ | 0.83 |
|   | Aminotriazole | 1.0 | | |
|   | Deionized water | Balance | | |
| 8 | Aminotetrazole | 1.0 | ○ | 0.81 |
|   | Deionized water | Balance | | |
| 9 | 1-methylaminotetrazole | 0.5 | ○ | 0.77 |
|   | Aminotriazole | 1.0 | | |
|   | Deionized water | Balance | | |
| Comparative Example 5 | — | | X | 0.54 |
| Comparative Example 6 | Aminotriazole | 1.0 | Δ | 0.48 |
|   | Deionized water | Balance | | |
| Comparative Example 7 | Benzotriazole | 0.5 | XX | 0.43 |
|   | Deionized water | Balance | | |
| Comparative Example 8 | Aminotetrazole | 0.01 | X | 0.50 |
|   | Deionized water | Balance | | |

Examples 7–9 and Comparative Examples 5–8

Except for using a 0.1 mm-thick FR-5 grade equivalent prepreg (MCL-E-679, manufactured by Hitachi Chemical Co., Ltd.) based on heat-resistance epoxy resin with a glass transition temperature of 173–183° C. as the impregnating resin, samples were prepared in the same manner as Examples 1–3 to conduct the inter-layer peel test and the peel-off strength test. Results are given in Table 2. Treatment with the aqueous solution was not carried out for the Comparative Example 5.

The results shown in Tables 1 and 2 demonstrate that the embodiment examples using the first or second aqueous solution in the present invention can yield superior inter-layer strength and peel-off strength, and in particular, heat resistance and moisture resistance are additionally obtained with the second aqueous solution.

TABLE 1

| Example | Composition of aqueous solution (% by weight) | | Inter-layer peel test | Peel-off strength (kgf/cm) | Heat resistance | Moisture resistance |
|---|---|---|---|---|---|---|
| 1 | Aminotetrazole | 1.0 | ○ | 0.82 | ○ | ○ |
|   | Aminotriazole | 1.0 | | | | |
|   | Deionized water | Balance | | | | |
| 2 | Aminotetrazole | 1.0 | ○ | 0.80 | Δ | Δ |
|   | Deionized water | Balance | | | | |
| 3 | 1-methylaminotetrazole | 0.5 | ○ | 0.78 | ○ | ○ |
|   | Aminotriazole | 1.0 | | | | |
|   | Deionized water | Balance | | | | |
| 4 | Aminotetrazole | 5.0 | ○ | 0.78 | Δ | ○ |
|   | Deionized water | Balance | | | | |
| 5 | Aminotetrazole | 0.1 | ○ | 0.82 | ○ | ○ |
|   | Aminotriazole | 0.1 | | | | |
|   | Deionized water | Balance | | | | |
| 6 | Aminotetrazole | 0.3 | ○ | 0.80 | Δ | Δ |
|   | Deionized water | Balance | | | | |
| Comparative Example 1 | — | | X | 0.57 | XX | XX |
| Comparative Example 2 | Aminotriazole | 1.0 | Δ | 0.57 | ○ | ○ |
|   | Deionized water | Balance | | | | |
| Comparative Example 3 | Benzotriazole | 0.5 | XX | 0.50 | Δ | Δ |
|   | Deionized water | Balance | | | | |
| Comparative Example 4 | Aminotetrazole | 0.01 | X | 0.57 | X | X |
|   | Deionized water | Balance | | | | |

As described in the above, the present invention provides for a method for bonding a resin which has a high glass transition temperature but low affinity to copper surfaces with a copper surface with sufficient adhesive strength, resulting in a copper-resin composite that has excellent heat and moisture resistance together with adhesive strength. The present invention is suitable for the manufacture of printed circuit boards for which heat resistance is particularly required.

Obviously, numerous modifications and variations of the present invention are possible in light of the above teachings. It is therefore to be understood that, within the scope of the appended claims, the invention may be practiced otherwise than as specifically described herein.

What is claimed is:

1. A method for treating copper or copper alloy, the method comprising coating a surface of copper or copper alloy with an aqueous solution to form a treated surface; and bonding to the treated surface a resin having a glass transition temperature of 150° C. or higher as determined by a TMA method, wherein the aqueous solution comprises aminotetrazole or an aminotetrazole derivative in a concentration of at least 0.05% by weight.

2. The method according to claim 1, wherein the concentration of the aminotetrazole or the aminotetrazole derivative is 0.1 to 5% by weight.

3. The method according to claim 1, wherein the resin is heat-resistant epoxy resin, polyimide, bismaleimide-triazine resin or polyphenylene ether.

4. The method according to claim 1, wherein the surface of copper or copper alloy is a roughened surface.

5. A method for treating copper or copper alloy, the method comprising coating a surface of copper or copper alloy with an aqueous solution to form a treated surface; and bonding to the treated surface a resin having a glass transition temperature of 150° C. or higher as determined by a TMA method; wherein the aqueous solution comprises aminotetrazole or an aminotetrazole derivative in a concentration of at least 0.05% by weight, and aminotriazole or an aminotriazole derivative in a concentration of at least 0.1% by weight.

6. The method according to claim 5, wherein the concentration of the aminotetrazole or the aminotriazole derivative is 0.1 to 5% by weight, and the concentration of the aminotriazole or the aminotriazole derivative is 0.3 to 5% by weight.

7. The method according to claim 5, wherein the resin is heat-resistant epoxy resin, polyimide, bismaleimide-triazine resin or polyphenylene ether.

8. The method according to claim 5, wherein the surface of copper or copper alloy is a roughened surface.

9. The method according to claim 1, wherein the aqueous solution further comprises at least one member of the group consisting of an alcohol, a nonionic surfactant, an ethylene oxide-propylene oxide copolymer, an aminopolyether, a metal salt and ammonia.

10. The method according to claim 5, wherein the aqueous solution further comprises at least one member of the group consisting of an alcohol, a nonionic surfactant, an ethylene oxide-propylene oxide copolymer, an aminopolyether, a metal salt and ammonia.

11. A method for bonding resin to copper or copper alloy, the method comprising coating a surface of copper or copper alloy with an aqueous solution to form a treated surface; and bonding to the treated surface a resin having a glass transition temperature of 150° C. or higher as determined by a TMA method, wherein the aqueous solution consists essentially of water and at least one member of the group consisting of aminotetrazole or an aminotetrazole derivative in a concentration of at least 0.05% by weight, and aminotriazole or an aminotriazole derivative in a concentration at least 0.1% by weight.

12. The method according to claim 11, wherein the concentration of the aminotetrazole or aminotetrazole derivative is between 0.1 and 5% by weight.

13. The method according to claim 11, wherein the concentration of the aminotriazole or aminotriazole derivative is 0.3 to 5% by weight.

14. The method according to claim 11, wherein the resin is heat-resistant epoxy resin, polyimide, bismaleimide-triazine resin or polyphenylene ether.

15. The method according to claim 11, wherein the surface of copper or copper alloy is a roughened surface.

* * * * *